United States Patent
Cohen

(10) Patent No.: US 8,193,860 B2
(45) Date of Patent: Jun. 5, 2012

(54) METHOD AND APPARATUS FOR AUTOMATICALLY CONTROLLING AN XNN® ENHANCEMENT CIRCUITRY FEEDING A POWER AMPLIFIER

(75) Inventor: Zeev Cohen, Zichron Yakeev (IL)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/514,402

(22) PCT Filed: Nov. 21, 2007

(86) PCT No.: PCT/IL2007/001439
§ 371 (c)(1),
(2), (4) Date: Dec. 20, 2009

(87) PCT Pub. No.: WO2008/062412
PCT Pub. Date: May 29, 2008

(65) Prior Publication Data
US 2010/0102879 A1    Apr. 29, 2010

Related U.S. Application Data

(60) Provisional application No. 60/860,094, filed on Nov. 21, 2006.

(51) Int. Cl.
*H03F 3/04* (2006.01)
(52) U.S. Cl. .................................. 330/207 P; 330/199
(58) Field of Classification Search .................. 330/199, 330/136, 297, 127, 290
See application file for complete search history.

(56) References Cited

U.S. PATENT DOCUMENTS

| | | | |
|---|---|---|---|
| 5,818,620 A | 10/1998 | Akimoto et al. | |
| 6,437,641 B1 | 8/2002 | Bar-David | |
| 6,608,522 B1 * | 8/2003 | Mumper et al. | 330/51 |
| 7,026,868 B2 * | 4/2006 | Robinson et al. | 330/10 |
| 7,339,426 B2 * | 3/2008 | Gurvich et al. | 330/136 |
| 7,352,240 B2 * | 4/2008 | Dupuis | 330/207 P |
| 2003/0146791 A1 | 8/2003 | Shvarts | |

FOREIGN PATENT DOCUMENTS
EP    1536556 A    6/2005
* cited by examiner

*Primary Examiner* — Hieu Nguyen
(74) *Attorney, Agent, or Firm* — Ramin Mobarhan

(57) ABSTRACT

Method and apparatus for automatically controlling the operation of a DC power enhancement circuitry connected to an RF power amplifier (PA) that operates at various input signal levels, according to which the instantaneous magnitude of the input signal is sensed and the instantaneous magnitude and its highest (lowest) peak are stored. For the time period during which the peak remains the highest (lowest) peak, the desired dynamic range of the power amplifier is determined according to the peak and a corresponding threshold level and the gain of the enhancement circuitry are determined according for that time period. Whenever the magnitude exceeds the corresponding threshold level, the enhancement circuitry provides to the power amplifier a level of DC power enhancement required for maintaining the output power of the power amplifier within the output dynamic range. Whenever a higher (lower) peak is detected, the process is repeated for the time period during which the lower peak remains the highest (lowest) peak of all preceding peaks and the value of the stored highest (lowest) peak is updated accordingly.

16 Claims, 4 Drawing Sheets

METHOD AND APPARATUS FOR AUTOMATICALLY CONTROLLING AN XNN® ENHANCEMENT CIRCUITRY FEEDING A POWER AMPLIFIER

FIELD OF THE INVENTION

The present invention relates to the field of high efficiency power amplifiers. More particularly, the invention relates to a control circuitry for dynamically determining the operating point of a circuitry used to enhance the DC power feeding to a power amplifier.

BACKGROUND OF THE INVENTION

Conventional RF amplifiers required to simultaneously amplify RF signals that have large peak-to-average ratios, are costly and relatively inefficient (i.e., consume much DC power). However, during most of the time, the power output is only a small fraction of the power consumed from the Direct Current (DC) power supply, resulting in low efficiency. The reason for such inefficiency is that on one hand, the DC conditions should be set to values that will be able to provide large power output, but on the other hand, for these DC conditions, such a power amplifier becomes efficient only during the occurrence of the peaks, i.e., when the instantaneous power output is large and the power amplifier is at saturation level.

In many wireless applications, controlling output power as a function of receiving level is required. Using back off from saturation level will reduce efficiency. Conventional power stages are designed to handle the highest power, leading to lower efficiency at lower output power.

A conventional technique for eliminating this problem is to control the DC supply of the power amplifier as a function of power level. One voltage level is supplied to such power amplifier whenever the transmitted power is below a given level (normal operating condition), and an enhanced (and higher) voltage level whenever the output power is above said level. The technique of eXcess eNvelope eNhancement (XNN®) for power amplifiers (PAs), particular for the low power WiFi and WiMAX market applications is disclosed in U.S. Pat. No. 6,437,641. This technique is a simplification of Envelope Tracking (ET), which is disclosed in US 2004/0018821.

The Voltage Enhancement Circuit (VEC™), disclosed in U.S. Pat. No. 6,831,519, modulates the supply voltage of power amplifiers as part of the XNN® technique. Appropriate modulation of the supply voltage prevents saturation of the power amplifier, while amplifying signals that exceed a pre-defined (fixed) programmable threshold. The resulting input drive to the PA is increased, thereby pushing its output well into saturation and eliminates the problem of signal clipping by instantaneously enhancing the power supply voltage.

The methods described above provided solutions only to the problem of improving the efficiency of power amplifiers operated under large peak-to-average ratios, while eliminating the need for clipping signals having large peak amplitudes. The XNN® technology suggests dynamically boosting the drain voltage of the PA to enlarge the output dynamic range of the PA.

All the methods described above have not yet provided satisfactory solutions to the problem of automatically controlling the XNN® enhancement threshold level while operating at various input levels and in a changing environment, in which the supply voltage, the temperature and other varying parameters affect the RF level monitored by the XNN® circuit.

It is therefore an object of the present invention to provide a method and apparatus for automatically controlling the XNN® enhancement threshold level, while operating at various input levels.

It is another object of the present invention to provide a method and apparatus for automatically controlling the XNN® enhancement operation with power amplifiers to be adjusted for different power amplifiers and different input signals.

It is a further object of the present invention to provide a method and apparatus to improve the enhancement operation of XNN® circuits/chips (integrated circuits) compared to XNN® chips with fixed threshold level.

It is yet another object of the present invention to provide a method and apparatus to compensate the enhancement operation of XNN® chips against gain variations in the power amplifier and against variations between XNN® chips during manufacturing.

Other objects and advantages of the invention will become apparent as the description proceeds.

SUMMARY OF THE INVENTION

The present invention is directed to a method for automatically controlling the operation of a DC power enhancement circuitry connected to an RF power amplifier (PA) that operates at various input signal levels. The instantaneous magnitude of the input signal is sensed and the instantaneous magnitude and its highest (lowest) peak are stored. For the time period during which the peak remains the highest (lowest) peak, the desired dynamic range of the power amplifier is determined according to the peak and a corresponding threshold level and the gain of the enhancement circuitry are determined according for that time period. Whenever the magnitude exceeds the corresponding threshold level, the enhancement circuitry provides to the power amplifier a level of DC power enhancement required for maintaining the output power of the power amplifier within the output dynamic range. Whenever a higher (lower) peak is detected, the process is repeated for the time period during which the lower peak remains the highest (lowest) peak of all preceding peaks and the value of the stored highest (lowest) peak is updated accordingly.

The present invention is also directed to an apparatus for automatically controlling the operation of a DC power enhancement circuitry connected to an RF power amplifier (PA) that operates at various input signal levels, that comprises:

a) a sensor for sensing the instantaneous magnitude of the input signal and storing the instantaneous magnitude and its highest (lowest) peak;

b) circuitry for determining the desired dynamic range of the power amplifier according to the peak and for determining a corresponding threshold level and the gain of the enhancement circuitry for the time period during which the peak remains the highest (lowest) peak; and c) circuitry for causing, whenever the magnitude exceeds the corresponding threshold level, the enhancement circuitry to provide to the power amplifier a level of DC power enhancement required for maintaining the output power of the power amplifier within the output dynamic range and for updating the value of the stored highest (lowest) peak for the time period during which the higher (lower) peak remains the highest (lowest) peak of all preceding peaks.

The desired dynamic range may be determined by the value of a resistor connected to the enhancement circuitry or by setting a reference voltage. The enhancement circuitry may be an XNN® circuit that may be implemented as an integrated circuit.

The PA may be operated under Class A, Class B, Class AB or Class C.

The magnitude of the input signal is determined by sensing the output power of the enhanced PA.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

The present invention proposes a method for automatically controlling the XNN® circuit by monitoring the input envelope level and dynamically determining the threshold levels required to start the enhancement provided by the XNN® circuitry. This way, the operation of the XNN® circuitry is automatically controlled.

Figure 1:
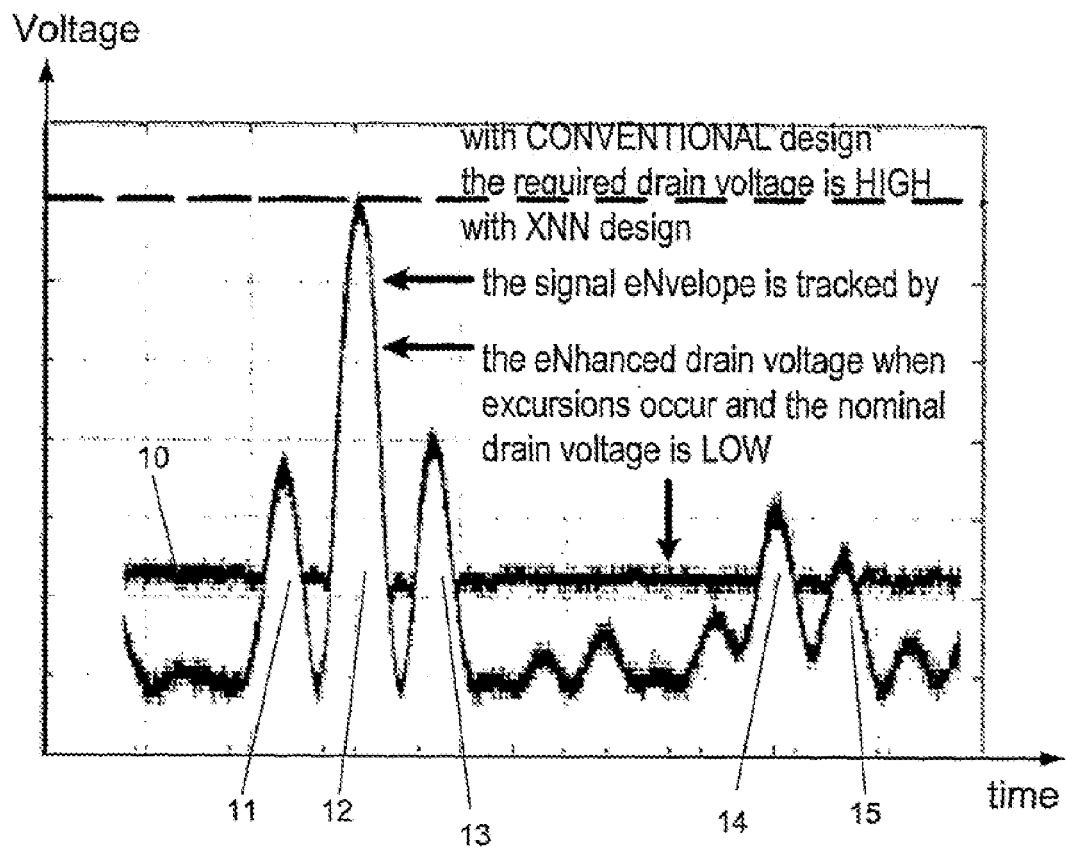
FIG. 1 (prior art) shows the output of a power amplifier during time periods with and without enhancement by the XNN® circuitry.

FIG. 1 (prior art) shows the output of a power amplifier during time periods with and without enhancement by the XNN® circuitry. In this case, the threshold is set in advance. Whenever the magnitude of the input signal exceeds this predetermined threshold 10, the XNN® circuitry provides enhancement by increasing the level of the drain voltage up to the required amount, such that the output dynamic range of the power amplifier will increase and clipping of the output signal will be avoided. Five different levels of enhancement are shown in time periods 11, 12, 13, 14 and 15, respectively. The predetermined threshold was defined by adjusting the gain of the detector of the input signal magnitude, which is a function of the detector's bias and the detector's voltage that may vary from XNN® circuitry to XNN® circuitry, particularly when manufactured as a monolithic chip. In addition, adjustment by trimming is not feasible for chip implementation and mass production. Therefore, setting the threshold to a single fixed level for all chips and all levels of input signals is not sufficient.

Figure 2A:
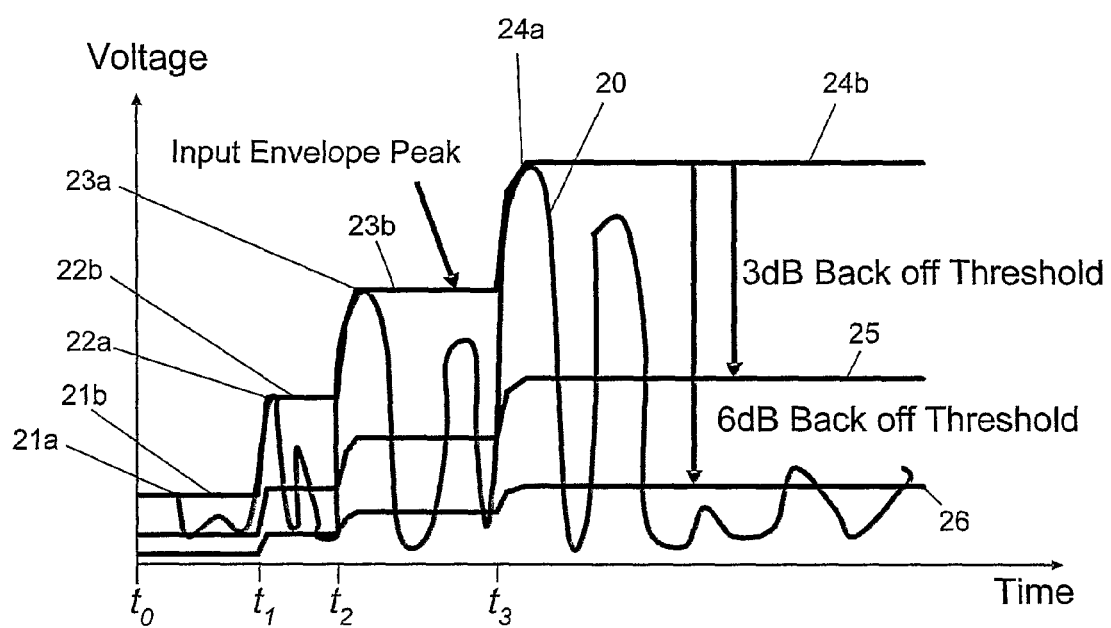
FIG. 2A illustrates two dynamic settings of threshold levels for the XNN® enhancement circuitry, according to a preferred embodiment of the invention.
Figure 2B:
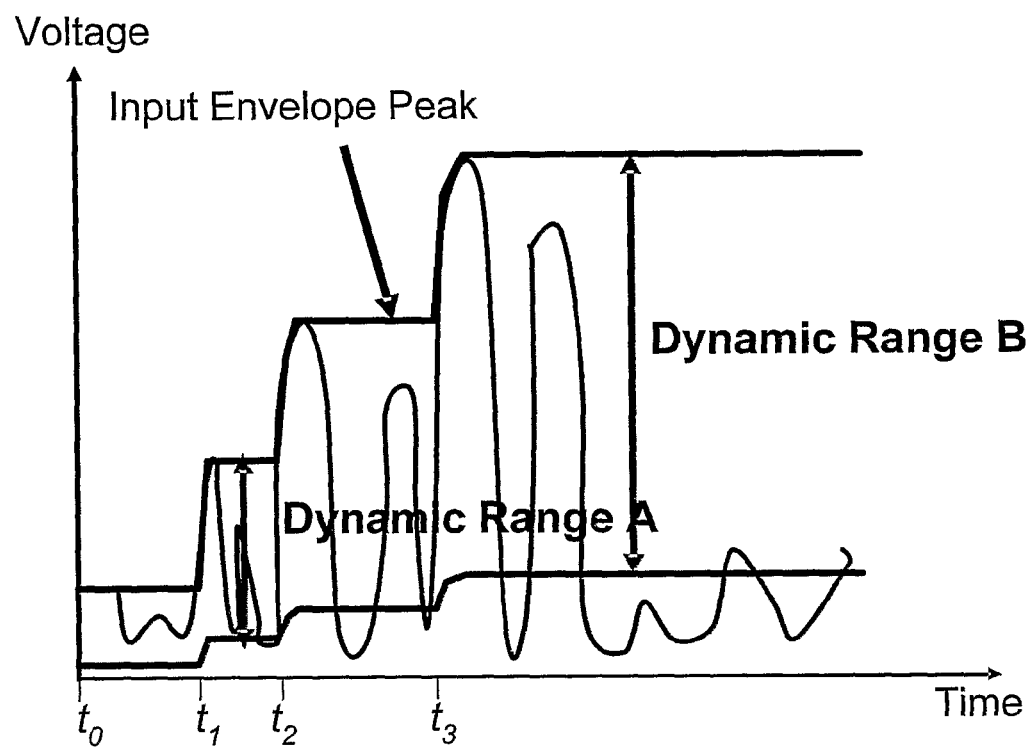
FIG. 2B shows different dynamic ranges for the power amplifier, defined by different "back off" threshold levels.

FIG. 2A illustrates two dynamic settings of threshold levels for the XNN® enhancement circuitry, according to a preferred embodiment of the invention. In the first example, the envelop of the input signal 20 is continuously detected and the threshold is set to be 3 dB below the highest peak level that has been detected (3 dB in power). The threshold 25 (i.e., the "back off" threshold level) remains constant as long as the current peak level is the highest level. Whenever a higher level of input signal is reached, the threshold level is increased to be 3 dB below the new (and higher) level. This process is repeated each time the input signal reaches a higher level than all preceding levels. In FIG. 2A, the first level 21a is determined by peak level 21b of the input signal, which is the highest for the time period from $t_0$ to $t_1$. The second level 22a is determined by peak level 22b of the input signal, which is the highest for the time period from $t_1$ to $t_2$. The third level 23a is determined by peak level 23b of the input signal, which is the highest for the time period from $t_2$ to $t_3$. The fourth level 24a is determined by peak level 24b of the input signal, which is the highest for the time period from $t_3$ and forth. Similarly, a lower dynamic threshold 26 is set for 3 dB below the highest peak level that has been detected. Each "back off" threshold level defines a different output dynamic range (dynamic range A between $t_1$ and $t_2$, dynamic range B from $t_3$ and forth etc.) for the power amplifier, as shown in FIG. 2B. Actually, the dynamic range is a function of the peak level of the input signal and the back off setting, which can be determined by an external resistor or by setting a reference voltage. This way, if the peak level of the input signal increases, the output dynamic range increases as well, as desired. In this example, enhancement will be provided by the XNN® circuitry for all input signals that exceed each "back off" threshold during its corresponding time period.

The solution proposed by the present invention allows automatically tracking the magnitude of the input signal and setting the threshold level required for obtaining the required output dynamic range for that magnitude. This feature is used to compensate gain variations between different power amplifiers, as well as performance variations between XNN® chips variations during their manufacturing process.

Automatic tracking may also occur in the opposite case (if the peak voltage decreases) in order to lower the threshold. The output dynamic range is defined by the input level of the envelope that will be amplified by the XNN circuitry and its driver, as the drain voltage boosting signal. This means that the described system not only sets the output dynamic range (by setting the threshold level) but also sets the gain needed in the XNN circuitry.

Figure 3:
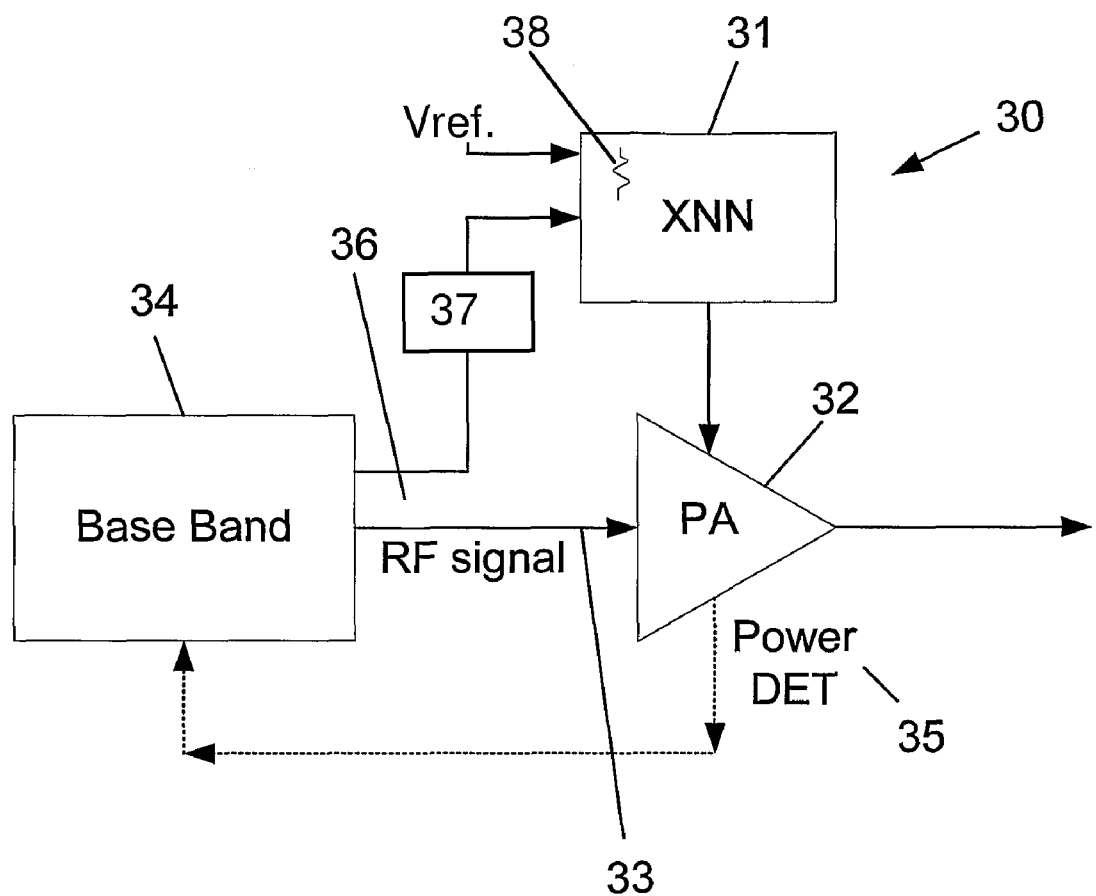
FIG. 3 is a block diagram of the system for automatically tracking the magnitude of the input signal and setting the threshold level required for obtaining the desired output dynamic range for that magnitude, as proposed by the present invention.

FIG. 3 is a block diagram of the system for automatically tracking the magnitude of the input signal and setting the threshold level required for obtaining the desired output dynamic range for that magnitude, proposed by the present invention. The system 30 comprises an XNN® circuitry 31 that provides DC power enhancement to the power amplifier 32, in order to increase the output dynamic range whenever required. The output power of the power amplifier is continuously sampled by a power detector 35 and fed back into the baseband generator 34 that generates an input signal 33 with a proper magnitude that is applied to the power amplifier's input in order to obtain a desired output signal. This magnitude is continuously sampled by an RF coupler 36 and fed into a detector 37 that continuously stores its peak value and sets the current threshold level required for obtaining the proper level of enhancement that corresponds to that current threshold and the desired output dynamic range. Any increase in the peak value will change (increase) the threshold level required for obtaining the proper level of enhancement and the desired output dynamic range that correspond to that increased threshold, and so forth. The same implementation may be done for the lowest peak level, by decreasing the threshold accordingly. The desired dynamic range may be determined by the value of a resistor 38 connected to the enhancement circuitry or by setting a reference voltage (Vref) within the enhancement circuitry.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. A method for automatically controlling an operation of a DC power enhancement circuitry connected to an RF power amplifier (PA) that operates at various input signal levels, comprising:
   a) Continuously sensing an instantaneous magnitude of said input signal by a coupler, which is followed by a detector and storing said instantaneous magnitude and its highest peak;
   b) For a time period during which said peak remains the highest peak:
      b.1) determining the desired dynamic range of said power amplifier according to said peak;
      b.2) determining a corresponding threshold level and a gain of said enhancement circuitry for said time period;
      b.3) whenever said magnitude exceeds said corresponding threshold level, causing said enhancement circuitry to provide to said power amplifier a level of DC power enhancement required for maintaining the output power of said power amplifier within said output dynamic range; and
   c) whenever a higher peak is detected, repeating steps b.1-b.3) above for the time period during which said higher peak remains the highest peak of all preceding peaks and updating the value of the stored highest peak accordingly.

2. A method for automatically controlling an operation of a DC power enhancement circuitry connected to an RF power amplifier (PA) that operates at various input signal levels, comprising:
   a) Continuously sensing an instantaneous magnitude of said input signal by a coupler, which is followed by a detector and storing said instantaneous magnitude and its lowest peak;
   b) For a time period during which said peak remains the lowest peak:
      b.1) determining the desired dynamic range of said power amplifier according to said peak;
      b.2) determining a corresponding threshold level and a gain of said enhancement circuitry for said time period;
      b.3) whenever said magnitude exceeds said corresponding threshold level, causing said enhancement circuitry to provide to said power amplifier a level of DC power enhancement required for maintaining the output power of said power amplifier within said output dynamic range; and
   c) whenever a lower peak is detected, repeating steps b.1-b.3) above for the time period during which said lower peak remains the lowest peak of all preceding peaks and updating the value of the stored lowest peak accordingly.

3. A method according to claim 1, wherein the desired dynamic range is determined by the value of a resistor connected to the enhancement circuitry.

4. A method according to claim 1, wherein the desired dynamic range is determined by setting a reference voltage.

5. A method according to claim 1, wherein the enhancement circuitry is an XNN® circuit.

6. A method according to claim 5, wherein the XNN® circuitry is implemented as an integrated circuit.

7. A method according to claim 1, wherein the PA is operated under the following classes:
   Class A;
   Class B;
   Class AB;
   Class C.

8. A method according to claim 1, wherein the magnitude of the input signal is determined by sensing the output power of the enhanced PA.

9. Apparatus for automatically controlling an operation of a DC power enhancement circuitry connected to an RF power amplifier (PA) that operates at various input signal levels, comprising:
   a) A detector for continuously sensing an instantaneous magnitude of said input signal and storing said instantaneous magnitude and its highest peak;
   b) A first circuitry for determining the desired dynamic range of said power amplifier according to said peak and for determining a corresponding threshold level and a gain of said enhancement circuitry for a time period during which said peak remains the highest peak; and
   c) A second circuitry for causing, whenever said magnitude exceeds said corresponding threshold level, said enhancement circuitry to provide to said power amplifier a level of DC power enhancement required for maintaining the output power of said power amplifier within said output dynamic range and for updating the value of the stored highest peak for the time period during which said higher peak remains the highest peak of all preceding peaks.

10. Apparatus for automatically controlling an operation of a DC power enhancement circuitry connected to an RF power amplifier (PA) that operates at various input signal levels, comprising:
    a) A detector for continuously sensing an instantaneous magnitude of said input signal and storing said instantaneous magnitude and its lowest peak;
    b) A first circuitry for determining the desired dynamic range of said power amplifier according to said peak and for determining a corresponding threshold level and a gain of said enhancement circuitry for a time period during which said peak remains the lowest peak; and
    c) A second circuitry for causing, whenever said magnitude exceeds said corresponding threshold level, said enhancement circuitry to provide to said power amplifier a level of DC power enhancement required for maintaining the output power of said power amplifier within said output dynamic range and for updating the value of the stored lowest peak for the time period during which said lower peak remains the lowest peak of all preceding peaks.

11. Apparatus according to claim 9, wherein the desired dynamic range is determined by the value of a resistor connected to the enhancement circuitry.

12. Apparatus according to claim 9, wherein the desired dynamic range is determined by setting a reference voltage.

13. Apparatus according to claim 9, wherein the enhancement circuitry is an XNN® circuit.

14. Apparatus according to claim 13, wherein the XNN® circuitry is implemented as an integrated circuit.

15. Apparatus according to claim 9, in which the PA is operated under the following classes:
Class A;
Class B;
Class AB;
Class C.

16. Apparatus according to claim 9, in which the magnitude of the input signal is determined by sensing the output power of the enhanced PA.

* * * * *